VAPOR PHASE ETCHING AND POLISHING OF SEMICONDUCTORS

Filed May 8, 1967

INVENTOR.
Robert G. Hays
BY
Mueller, Aichele & Rauner
ATTY'S.

United States Patent Office 3,511,727

Patented May 12, 1970

3,511,727

VAPOR PHASE ETCHING AND POLISHING OF SEMICONDUCTORS

Robert G. Hays, Scottsdale, Ariz., assignor to Motorola, Inc., Franklin Park, Ill., a corporation of Illinois Filed May 8, 1967, Ser. No. 636,928
Int. Cl. H01l 7/50, 7/44
U.S. Cl. 156—17 10 Claims

ABSTRACT OF THE DISCLOSURE

A semiconductor surface is etched or polished with a gaseous mixture comprising an interhalogen compound of fluorine, for example, $ClF_3$, at temperatures as low as 100° C. using hydrogen as a diluent and carrier gas. At a temperature of 1200° C. silicon is etched at a rate as high as seven microns per minute without losing a mirror-smooth surface. The etched or polished surface is particularly suited for subsequent epitaxial semiconductor growth, or for doping with impurities using known solid state diffusion techniques.

BACKGROUND

Figure 1:
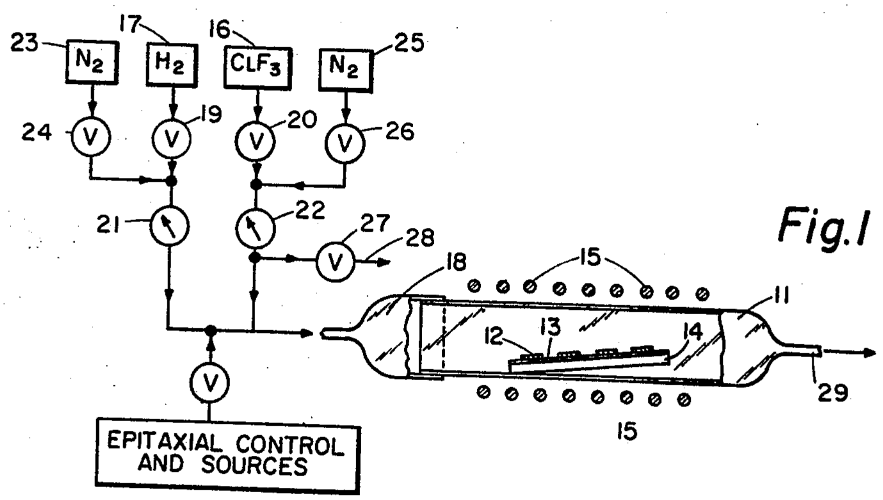

This invention relates generally to the processing of semiconductor materials, and to the fabrication of semiconductor structures for use in the assembly of transistors, diodes and other semiconductor devices. A method is provided for gas phase etching and polishing of semiconductor surfaces with an interhalogen compound of fluorine.

In the processing of semiconductor materials, including particularly germanium and silicon, the need for extremely smooth, flat and clean surfaces has been well established. Until recently such surfaces were prepared by a sequence of steps involving lapping and mechanical polishing of a surface, followed by liquid phase chemical etching. Improved chemical etching and polishing techniques are now available, however, with the advent of vapor phase etching as described in U.S. Pat. No. 3,243,-323 to Wilford J. Corrigan et al. As explained in the Corrigan et al. patent, gas phase etching is carried out by mounting the semiconductor material in a suitable high temperature reaction chamber and passing a gaseous mixture comprising hydrogen and hydrogen chloride in contact with the heated semiconductor material.

There is a continuing need, however, for improved vapor phase etching techniques. In particular, substantially greater processing flexibility and convenience can be achieved by the development of a gas phase etching method capable of satisfactory etch rates and reproducible mirror-like finishes at temperatures well below the 850° C. minimum taught by Corrigan et al. for the HCl etching of silicon.

THE INVENTION

It is an object of the present invention to achieve non-preferential vapor phase etching and polishing of silicon and germanium at temperatures far lower than is characteristic of prior vapor phase etching. It is a further object of the invention to provide a vapor phase etching process for use in the processing of semiconductor structures having temperature sensitive impurity profiles, whereby selective etching can be achieved without redistribution of existing impurity profiles.

Gold as an impurity is commonly employed in the collector region of RF transistors, for example, to reduce minority carrier lifetimes. Since gold has a very high diffusivity, it would be rapidly redistributed if such a structure were heated substantially above 350° C. Therefore, prior gas-phase etching techniques cannot be employed once the gold is in place. But the halogen fluorides, and particularly $ClF_3$ are easily capable of rapid etching below 350° C.

It is a further object of the invention to provide a low temperature gas phase etching process for cleaning refractory boats used in epitaxial furnaces, for example. It is known to etch-clean such boats with HCl at high temperatures, requiring the use of expensive, HCl-resistant furnaces. But the use of halogen fluorides at low temperatures permits the use of inexpensive equipment without sacrificing the speed or efficiency of cleaning.

It is a feature of the present invention to etch or polish silicon or germanium surfaces with an interhalogen compound of fluorine selected from the group consisting of chlorine monofluoride, chlorine trifluoride, bromine monofluoride, bromine trifluoride, bromine pentafluoride, iodine pentafluoride, and iodine heptafluoride.

Another feature of the invention is the use of vapor phase etch-cleaned silicon dioxide films as masks to limit the growth of epitaxial layers of silicon and germanium to selected regions of a semiconductor surface.

Another feature of the invention is the use of substantially nitrogen-free hydrogen gas as a carrier and diluent for the halogen fluoride etchants of the invention.

Another feature of the invention is the use of temperatures as low as 100° C. to accomplish non-preferential etching of semiconductor materials in order to permit a masked etching of selected regions of semiconductor structures having temperature sensitive impurity profiles.

An additional feature of the invention is the fact that the halogen fluorides do not attack aluminum appreciably, especially at low temperatures. This permits the use of metallization procedures involving an etch step after aluminum metallization, to prepare for interconnection of various circuit elements of an integrated circuit, for example, or other step-wise metallization. Moreover, the use of aluminum as a masking layer for selective etching with halogen fluorides adds a valuable measure of flexibility to wafer processing technology.

The invention is embodied in a method for non-preferential etching of semiconductor material comprising the steps of contacting silicon or germanium with a gaseous mixture containing hydrogen and an interhalogen compound of fluorine, while maintaining the temperature of the semiconductor material above 100° C.

A further embodiment of the invention includes the step of etching or polishing semiconductor material with a gaseous mixture containing hydrogen and an interhalogen compound of fluorine, while maintaining the temperature of the semiconductor material above 100° C., followed by the step of contacting the etched or polished material with a gaseous decomposable compound of a semiconductor material, at epitaxial growth-sustaining conditions.

Another embodiment of the invention includes the step of contacting semiconductor material with a gaseous mixture containing hydrogen and an interhalogen compound of fluorine, while maintaining the temperature of the semiconductor material above 100° C., followed by the step of contacting said material with a gaseous decomposable compound of a conductivity type-determining impurity at conditions suitable for the diffusion of such impurities into the semiconductor material.

A further embodiment includes the gas-phase etch, as above, followed by the vapor-deposition of a passivating oxide layer such as silicon dioxide, for example, It now becomes feasible to etch-clean a semiconductor surface which includes the terminus of a p–n junction, without fear of "smearing" or degrading the junction. Thereafter, a passivating oxide layer is deposited on the etch-cleaned surface.

In accordance with a further embodiment the metallization of a semiconductor device is carried out by selectively etching "windows" in a mask prepared by known procedures, using a liquid-phase chemical etch, then vapor-phase etch-cleaning the exposed semiconductor surfaces with a halogen fluoride-comprising gas, and then completing the metallization.

Chlorine trifluoride is generally considered to be the most reactive compound of all the halogen fluorides. It is a corrosive, colorless gas at room temperature and atmospheric pressure. It has a somewhat sweet odor and is highly irritating even at low concentrations. It is easily liquified to a yellow-green liquid at low pressures and ambient temperatures. It freezes at about −76° C. to form a white solid.

It is powerful oxidizing agent, causing immediate ignition of many organic compounds. It will ignite many metals at elevated temperatures, and will react violently with water or ice. It is available commercially as a liquified gas shipped under its own vapor pressure of about seven p.s.i.g. at 70° F.

Chlorine trifluoride is also the most toxic and most hazardous compound of the halogen fluorides. Accordingly, it should be handled only by experienced personnel acting with extreme caution. Although the remaining hydrogen fluorides may be somewhat less toxic and hazardous, they should, of course, be handled only by experienced personnel exercising great care.

Chlorine triuuoride is capable of etching silicon and germanium even at room temperature. Moreover, inert gases other than hydrogen, such as nitrogen and argon, may be employed as a carrier and diluent. However, the use of temperatures below 100° C., and the use of carrier-diluents other than hydrogen, are not recommended since a preferential attack of certain semiconductor crystal planes may result, thereby producing a rough surface as opposed to the mirror finishes required for the purposes of the invention.

DRAWINGS

Figure 2:
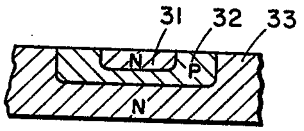
Figure 3:
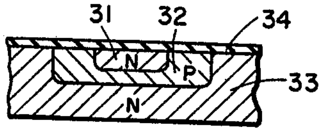
Figure 4:
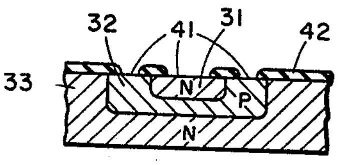
Figure 5:
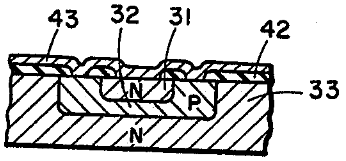
Figure 6:
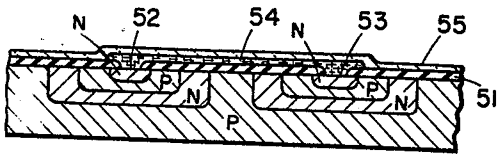
Figure 7:
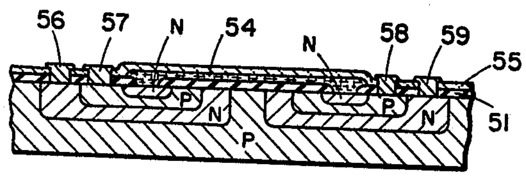

FIG. 1 is a schematic drawing of suitable apparatus for practicing the present invention; FIGS. 2 and 3 illustrate a sequence of processing steps for fabricating a semiconductor structure involving the deposition of an $SiO_2$ layer. FIGS. 4 and 5 illustrate the invention as used in a metallization sequence. FIGS. 6 and 7 illustrate a use of the invention for step-wise metallization of an integrated circuit.

The system of FIG. 1 consists of a reaction chamber 11, typically of quartz, in combination with suitable equipment for handling the process flow of the various gas streams employed in practicing the invention. Germanium or silicon wafers 12 are shown on a slab 13 of quartz, resting upon a susceptor 14 of graphite or SiC-coated molybdenum. Uncoated molybdenum or tantalum is generally unsuitable because of chemical reactivity with the etchants of the invention.

The susceptor 14 is heated by any suitable means, for example, by radio frequency energy from induction coils 15 energized by an induction heating oscilaltor (not shown). The germanium or silicon material is heated primarily by conduction from the susceptor, although substantial direct heating of the semiconductor by induction does occur in the event substantially elevated temperatures are employed.

Dry vapor phase chlorine trifluoride, for example, from supply tank 16 and hydrogen from supply vessel 17 enter the reactilon chamber 11 through removable entrance cap 18. The flow rates of the hydrogen and the etchant gas, and the relative proportions of the two, are controlled with the aid of valves 19 and 20 in combination with flow rate meters 21 and 22. Nitrogen or other inert gas supply 23 is provided for purging the system before the introduction of hydrogen into the reaction chamber, and also for purging at the end of a run to remove the hazardous gases. Similarly, inert gas supply 25 controlled by valve 26 is provided for purging the etchant line before and after use. An auxiliary burn-off line 28 controlled by valve 27 is provided as a convenient means of diverting etchant gas from chamber 11 without changing the setting of valve 20.

For purging, valve 24 is opened to the reaction chamber while all the remaining valves are closed, allowing nitrogen to flow through the apparatus for several minutes. Thereafter, $H_2$ alone is passed through the chamber to flush out the nitrogen. The presence of nitrogen has been found detrimental to the etching step, and, therefore, must be maintained below 50 parts per million by weight in the hydrogenhalogen fluoride etching stream.

Gaseous halogen fluoride from supply vessel 16 is diluted to the proper concentration by mixing with hydrogen gas. A mixture of the two gases is passed over wafers 12 at suitable flow rates for etching and polishing by the halogen fluoride. The concentration of etchant gas is maintained between 0.01% and 2.0% by weight. The products of the etching reaction are volatile, and are therefore swept through the reaction chamber by the hydrogen diluent, and to burn off vent 29 for disposal.

Once etching or polishing is complete, the wafers may be removed from the reaction chamber. However, it is an attractive feature of gas phase etching that the wafers may readily be subjected to subsequent processing without removal from the reaction chamber. That is, the wafers are conveniently left undisturbed in the hydrogen atmosphere inherently present at the termination of the etching process.

Epitaxial layers may then be grown on the wafers by switching the gas flow to a mixture of hydrogen and an appropriate volatile, decomposable compound of the semiconductor material, while maintaining the wafers at a sufficiently elevated temperature for deposition. For example, in the case of silicon the decomposable compound may be silicon tetrachloride or trichlorosilane. For the deposition of epitaxial germanium the use of germanium tetrachloride is suitable. The temperature of the wafers is typically maintained between 700° and 850° C. for the growth of a germanium layer; and between 1000° and 1300° C. for the growth of epitaxial silicon. The gaseous semiconductor compound reacts preferentially at the exposed wafer surfaces thereby depositing a layer of monocrystalline semiconductor metal having the same crystalline orientation as the substrate wafer.

In order to dope the epitaxial layer as it grows, a decomposable vapor of a selected impurity is mixed with the gaseous stream supplied for epitaxial growth. Suitable compounds are the hydrides of phosphorous, boron and arsenic; i.e., phosphine, diborane and arsine. The epitaxial growth and doping processes may be controlled very accurately, as known in the art, whereby a completed layer is held to strict specifications as to doping levels and thickness.

One problem frequently observed in the effort to obtain high quality epitaxially grown material is the deposit of small amounts of the semiconductor on the walls of the reaction chamber, and on other objects in the chamber, in addition to the desired deposition upon the wafers themselves. Such extraneous deposits subsequently tend to flake away and settle on the wafers, causing irregularities in the epitaxial growth which lead to pitted or spotted regions of poor quality.

However, by exposing the quartz reaction chamber and other objects such as the silicon carbide boats used within the reaction chamber to the halogen fluoride vapor treatment of the present invention, the subsequent extraneous germanium and silicon growth is greatly reduced. Since there are fewer flakes or specks of material to settle on the wafers, the quality of the resulting epitaxial material is substantially improved.

Gas phase halogen fluoride etching is also useful as a pretreatment for semiconductor material immediately prior to and occasionally following solid state diffusion operations. Such operations may usually be carried out in the same apparatus in which the etching is performed. In accordance with known methods of diffusion, for example, a gaseous impurity source material such as the phosphine, diborane, or arsine mentioned above is diluted with hydrogen or other carrier gas and passed over the semiconductor wafers while the latter are maintained at a suitably elevated temperature. The impurity passes into the semiconductor crystal by solid state diffusion to establish a selected conductivity type and resistivity.

When vapor phase halogen fluoride etching is carried out immediately prior to diffusion, the surface of the semiconductor is extremely clean and ideally suited for diffusion since the rate at which the impurity will enter the surface is uniformly the same across the entire semiconductor surface.

Additionally, the high concentration of impurity existing at the surface may be lowered by subsequent gas phase halogen fluoride etching to remove the surface levels. This is a useful technique in that it allows alteration of the electrical resistivity, breakdown, surface recombination velocity, and other characteristics of the structure.

FIGS. 2 and 3 are enlarged, fragmented, cross-sectional views of a planar transistor or other planar semiconductor device. In FIG. 2 the emitter and collector junctions 31 and 32, respectively, terminate at an unpassivated surface 33. In order to prepare the surface for vapor deposition of $SiO_2$ or other passivation, the surface shown in FIG. 2 is subjected to vapor phase etch-cleaning and polishing with a halogen fluoride in accordance with the present invention. Thereafter, as shown in FIG. 3, a layer of passivating oxide is deposited by known procedures.

Prior to this invention, only a liquid phase etch was available for such purposes, since the temperatures required for HCl etching would rapidly distort the impurity profiles and ruin the p-n junctions.

FIGS. 4 and 5 are enlarged, fragmented cross-sectional views of a planar transistor or other planar semiconductor device. In FIG. 4 windows 41 are shown in a surface layer 42 of $SiO_2$ or other masking material, prepared for metallization. The windows are etched by a liquid phase chemical etchant, followed by rinsing and drying in the usual manner. Such conventional operations inevitably leave at least a monomolecular layer of contamination, primarily semiconductor oxide. Etch-cleaning with a vapor phase HCl treatment is not feasible because the high temperature required would damage the junctions. The present invention permits low-temperature gas-phase etch-cleaning of the exposed semiconductor surface at windows 41, thereby improving the surface for receiving metallization layer 43 as shown in FIG. 5. The metallization pattern is then completed in a conventional manner.

FIGS. 6 and 7 are enlarged, fragmented, cross-sectional views of an integrated circuit structure, showing two discrete devices. The structure shown in FIG. 6 is prepared by etching windows 52 and 53 in oxide layer 51, then depositing antimony-doped gold across the entire wafer, and selectively etching the gold layer to form interconnecting member 54 between the two emitter zones. Glass insulating layer 55 is then deposited by any suitable low-temperature vapor-deposition method.

As shown in FIG. 7, aluminum contacts 56, 57, 58, and 59 are formed by first etching windows through glass layer 55 and oxide 51, then depositing aluminum over the entire wafer, and subsequently etching away the excess aluminum layer to form the contacts. In accordance with the present invention, the semi-conductor surface exposed at the windows is cleaned by vapor-phase etching with chlorine trifluoride or other halogen fluoride at low temperatures. Vapor-phase etch-cleaning with HCl or other hydrogen halides would not be feasible, since the high temperatures required would melt the gold connection 54.

I claim:

1. A method for non-preferential etching of semiconductor material selected from the group consisting of silicon and germanium, which comprises contacting said material with a gaseous mixture containing hydrogen and below 50 parts per million by weight of nitrogen and between 0.01% and 2.0% by weight of an interhalogen compound of fluorine, while maintaining the temperature of said semiconductor material above 100° C.

2. A method as defined by claim 1 wherein said interhalogen compound is selected from the group consisting of $ClF$,$ClF_3$, $BrF$, $BrF_3$, $BrF_3$, $BrF_5$ $IF_5$ and $IF_7$.

3. A method as defined by claim 1 wherein the semiconductor material is contacted with a flowing stream of said gaseous mixture (and the concentration of said interhalogen compound in said stream is maintained between 0.01% and 2.0% by weight).

4. A method as defined by claim 1 wherein selected areas of said semiconductor material are masked with $SiO_2$.

5. A method as defined by claim 1 wherein the etching is followed by metallization.

6. A method as defined by claim 1 wherein the etching is followed by deposition of a passivating oxide layer on the etched surface.

7. A method for processing a semiconductor material selected from the group consisting of silicon and germanium which comprises contacting said material with a gaseous mixture containing hydrogen and below 50 parts per million by weight of nitrogen and between 0.01% and 2.0% by weight of an interhalogen compound of fluorine, while maintaining the temperature of said semiconductor material above 100° C., and thereafter contacting said material with a gaseous decomposable compound of said semiconductor material at epitaxial growth-sustaining conditions.

8. A method as defined by claim 7 wherein said interhalogen compound is selected from the group consisting of $ClF$, $ClF_3$, $BrF$, $BrF_3$, $BrF_5$, $IF_5$ and $IF_7$.

9. A method as defined by claim 7 wherein the semiconductor material is contacted with a flowing stream of said gaseous mixture (and the concentration of said interhalogen compound in said stream is maintained between 0.01% and 2.0% by volume).

10. A method as defined by claim 7 wherein selected areas of the semiconductor material are masked with $SiO_2$ prior to and during the steps of claim 7.

References Cited

UNITED STATES PATENTS 3,243,323 3/1966 Corrigan et al. ---- 156—17 XR

OTHER REFERENCES

Chemical Abstracts vol. 66, 1967, p. 5403, Item 57068V Calibration Tests on Vacuum Gages in Corrosive Fluoride Gases.

J. H. STEINBERG, Primary Examiner

U.S. Cl. X.R.

117—213, 229; 148—175